United States Patent
Choi

(10) Patent No.: US 12,402,484 B2
(45) Date of Patent: Aug. 26, 2025

(54) DISPLAY DEVICE COMPRISING MULTIPLE CHARGE TRAP LAYERS

(71) Applicant: Samsung Display Co., Ltd., Yongin-Si (KR)

(72) Inventor: Jung-Mi Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 17/842,149

(22) Filed: Jun. 16, 2022

(65) Prior Publication Data

US 2023/0135544 A1    May 4, 2023

(30) Foreign Application Priority Data

Nov. 3, 2021 (KR) .................. 10-2021-0149696

(51) Int. Cl.
*H10K 59/122* (2023.01)
*H10D 86/40* (2025.01)
*H10D 86/60* (2025.01)
*H10K 50/86* (2023.01)

(52) U.S. Cl.
CPC ......... *H10K 59/122* (2023.02); *H10K 50/865* (2023.02); *H10D 86/411* (2025.01); *H10D 86/60* (2025.01)

(58) Field of Classification Search
CPC ............... H10K 59/122; H10K 50/865; H10K 59/8792; H10D 86/411
See application file for complete search history.

(56) References Cited

U.S. PATENT DOCUMENTS

| | | |
|---|---|---|
| 2015/0123098 A1 | 5/2015 | Kang |
| 2015/0311468 A1* | 10/2015 | An .......... H10K 50/87 438/26 |
| 2018/0012947 A1 | 1/2018 | Lee et al. |
| 2021/0242423 A1 | 8/2021 | Lee |
| 2021/0257429 A1* | 8/2021 | He .......... H10K 59/124 |
| 2022/0140033 A1* | 5/2022 | Kim .......... H10D 30/694 257/40 |
| 2023/0137476 A1* | 5/2023 | Choi .......... H10K 59/122 257/211 |

(Continued)

FOREIGN PATENT DOCUMENTS

| | | |
|---|---|---|
| JP | 6108898 B2 | 4/2017 |
| KR | 10-1302619 B1 | 9/2013 |

(Continued)

*Primary Examiner* — Nduka E Ojeh
(74) *Attorney, Agent, or Firm* — Innovation Counsel LLP

(57) ABSTRACT

A display device may include a first substrate, a first barrier layer disposed on the first substrate, a second substrate disposed on the first barrier layer, a second barrier layer disposed on the second substrate, a buffer layer disposed on the second barrier layer, a first charge trap layer disposed on the buffer layer and including silicon oxide, a second charge trap layer disposed on the first charge trap layer, the second charge trap layer including silicon oxide, and having an oxygen atom content smaller than an oxygen atom content of the first charge trap layer, a semiconductor layer disposed on the second charge trap layer and a light emitting element disposed on the semiconductor layer. The display device shows little afterimage and high luminance.

20 Claims, 14 Drawing Sheets

(56) References Cited

U.S. PATENT DOCUMENTS

2023/0236504 A1\* 7/2023 Park .................. G03F 7/035
                                                                             430/284.1

FOREIGN PATENT DOCUMENTS

| KR | 10-2015-0052645 A | 5/2015 |
| KR | 10-2015-0125151 A | 11/2015 |
| KR | 10-1782557 B1 | 9/2017 |
| KR | 10-2018-0005581 A | 1/2018 |
| KR | 10-2021-0099246 A | 8/2021 |

\* cited by examiner

DISPLAY DEVICE COMPRISING MULTIPLE CHARGE TRAP LAYERS

This application claims priority to Korean Patent Application No. 10-2021-0149696 filed on Nov. 3, 2021, and all the benefits accruing therefrom under 35 U.S.C. § 119, the content of which in its entirety is herein incorporated by reference.

BACKGROUND

1. Field

Embodiments relate to a display device. More particularly, embodiments relate to an organic light emitting display device.

2. Description of the Related Art

With an advancement of technology, display devices that are smaller and lighter and have better performance are being produced. Previously, a CRT television was widely used as a display device and it had it offered certain advantages such as price. However, CRT also had some disadvantages, and a display device that overcomes shortcomings of the CRT television in terms of miniaturization, portability from weight reduction, and low power consumption is increasing in popularity. For example, a plasma display device, a liquid crystal display device, an organic light emitting display device, a quantum dot display device, etc. are attracting attention. Recently, there has been an increase in demand for a display device having reduced afterimage and higher luminance.

SUMMARY

Embodiments may provide a display device with improved display quality.

A display device includes a first substrate, a first barrier layer disposed on the first substrate, a second substrate disposed on the first barrier layer, a second barrier layer disposed on the second substrate, a buffer layer disposed on the second barrier layer, a first charge trap layer disposed on the buffer layer and including silicon oxide, a second charge trap layer disposed on the first charge trap layer, the second charge trap layer including silicon oxide, and having an oxygen atom content smaller than an oxygen atom content of the first charge trap layer, a semiconductor layer disposed on the second charge trap layer and a light emitting element disposed on the semiconductor layer.

A difference between the oxygen atom content of the first charge trap layer and the oxygen atom content of the second charge trap layer may be about 4 at % to about 6 at %.

The oxygen atom content of the second charge trap layer may be about 49 at % to about 51 at %.

The oxygen atom content of the first charge trap layer may be about 54 at % to about 56 at %

The first charge trap layer and the second charge trap layer may include a hydrogen atom (H) and a nitrogen atom (N), and a ratio of N—H bonds of the second charge trap layer may be greater than a ratio of N—H bonds of the first charge trap layer.

The ratio of the N—H bond of the second charge trap layer may be about 0.7 at % to about 1 at %.

The ratio of the N—H bonds of the first charge trap layer may be about 0.3 at % or less.

A thickness of the second charge trap layer may be smaller than a thickness of the first charge trap layer.

A sum of the thickness of the first charge trap layer and the thickness of the second charge trap layer may be about 3500 angstroms.

The thickness of the second charge trap layer may be about 500 angstroms to about 1500 angstroms.

The thickness of the first charge trap layer may be about 2000 angstroms to about 3000 angstroms.

The display device may further include a third charge trap layer disposed between the first substrate and the buffer layer and including silicon nitride.

The third charge trap layer may be formed under ammonia free ($NH_3$ free) conditions.

The third charge trap layer may be disposed between the first barrier layer and the second substrate.

The third charge trap layer may be disposed between the second substrate and the second barrier layer.

The third charge trap layer may be disposed on the second barrier layer.

The second charge trap layer may be in contact with the semiconductor layer.

The light emitting element may include a pixel electrode electrically connected to the semiconductor layer, an intermediate layer disposed on the pixel electrode and a common electrode disposed on the intermediate layer, and the display device may further include a pixel defining layer disposed on the pixel electrode including an opening exposing a portion of the pixel electrode, and having a black color.

In an embodiment, the pixel defining layer may include a black pigment.

In an embodiment, an optical density of the pixel defining layer may be about 1.

The display device may include the first charge trap layer having the first oxygen atom content and the first ratio of the N—H bond, and the second charge trap layer having the second oxygen atom content lower than the first oxygen atom content and the second ratio of the N—H bond greater than the first ratio of the N—H bond, and a pixel defining layer having a black color. The second charge trap layer may improve a long-term afterimage of the display device. The first charge trap layer may reduce a defective rate of pixels included in the display device. The pixel defining layer may further improve the long-term afterimage of the display device. Accordingly, the display quality of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
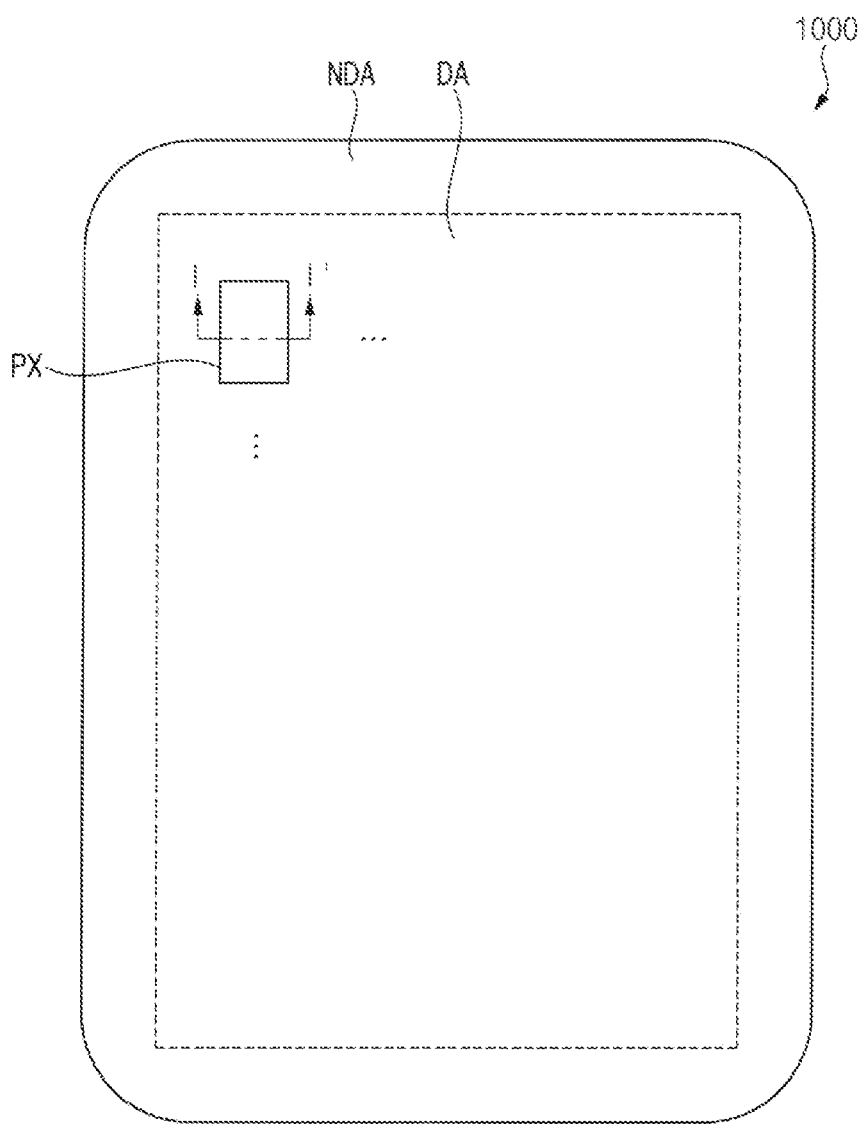
FIG. 1 is a plan view illustrating a display device according to an embodiment.

The inventive concept now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a plan view illustrating a display device according to an embodiment.

Referring to FIG. 1, the display device 1000 according to an embodiment of the present inventive concept may include a display area DA and a non-display area NDA.

A pixel PX may be disposed in the display area DA. The pixel PX may emit light. The display area DA may display an image.

The non-display area NDA may surround at least a portion of the display area DA.

Drivers may be disposed in the non-display area NDA. The drivers may be bent toward a rear surface of the display device 1000 so as not to be viewed in a plan view of the display device 1000. The drivers may provide a signal and/or a voltage to the pixel PX. The pixel PX may emit light based on a signal and/or a voltage provided from the drivers. For example, the drivers may include a gate driver, a data driver, a light emitting driver, a power voltage generator, a timing controller, and the like. The non-display area NDA may not display an image.

The display device 1000 may include an organic light emitting display device, an inorganic light emitting display device, a quantum dot light emitting display device, a micro LED display device, a nano LED display device, a plasma display device, a liquid crystal display device, and the like.

Figure 2:
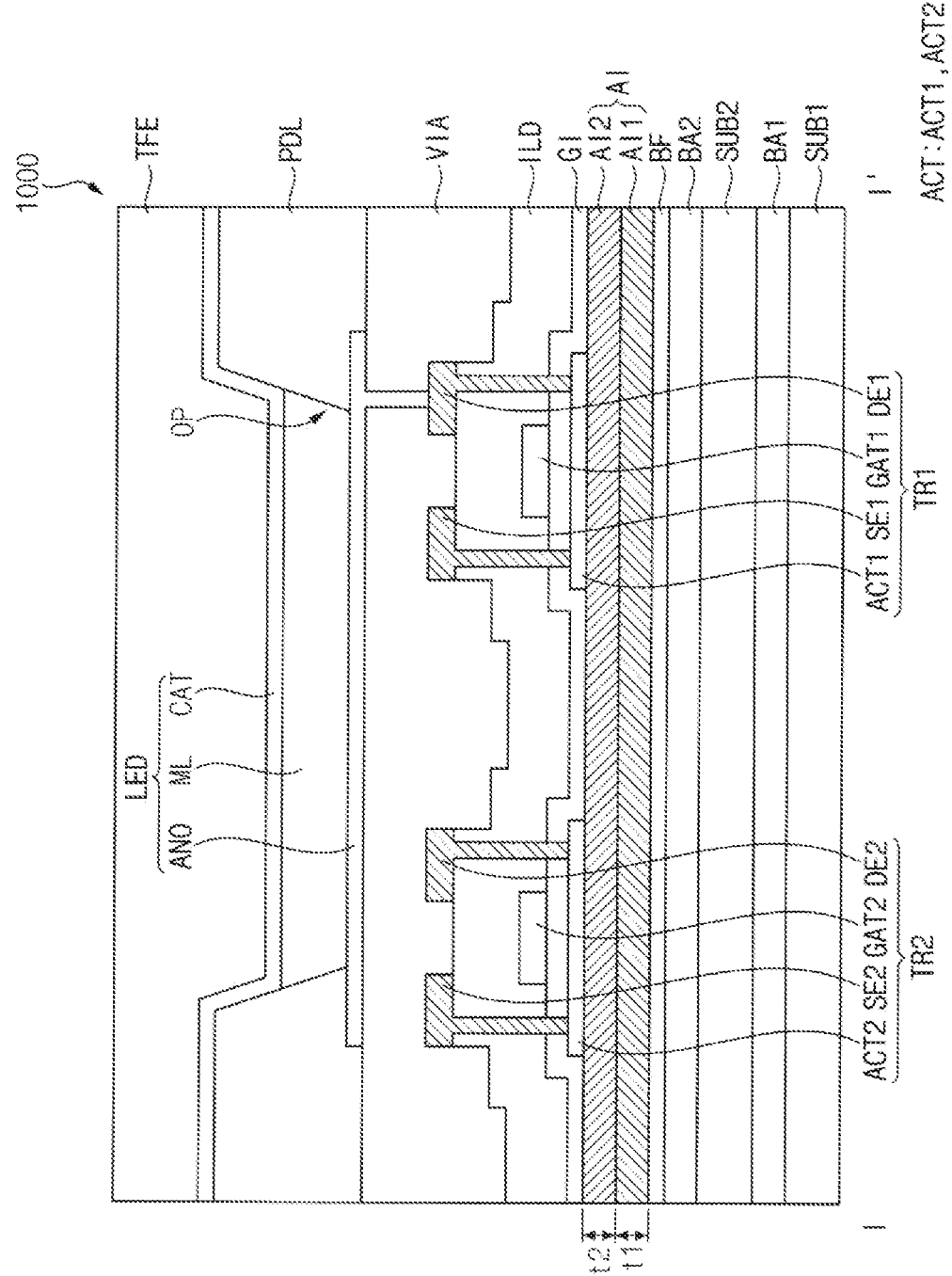
FIG. 2 is a cross-sectional view taken along line I-I' of FIG. 1.

FIG. 2 is a cross-sectional view taken along line I-I' of FIG. 1.

Referring to FIG. 2, the display device 1000 may include a first substrate SUB1, a first barrier layer BA1, a second substrate SUB2, a second barrier layer BA2, a buffer layer BF, a charge trap layer AI, a first transistor TR1, a second transistor TR2, a gate insulating layer GI, an interlayer insulating layer ILD, a via insulating layer VIA, a light emitting element LED, a pixel defining layer PDL, and a thin film encapsulation layer TFE.

The first transistor TR1 may include a first active pattern ACT1, a first gate electrode GAT1, a first source electrode SE1, and a first drain electrode DEL The first transistor TR1 may be a driving transistor.

The second transistor TR2 may include a second active pattern ACT2, a second gate electrode GAT2, a second source electrode SE2, and a second drain electrode DE2. The second transistor TR2 may be a switching transistor.

The semiconductor layer ACT may include a first active pattern ACT1 and a second active pattern ACT2.

The light emitting element LED may include a pixel electrode ANO, an intermediate layer ML, and a common electrode CAT.

In an embodiment, the first substrate SUB1 may include a polymer material. Examples of the polymer material may include polyimide, polyethersulphone, polyacrylate, polyarylate, polyetherimide, polyethylene naphthalate, polyethylene terephthalate, polyphenylene sulfide, polyallylate, polycarbonate, cellulose triacetate, cellulose acetate propionate, and the like. These may be used alone or in combination with each other. However, the polymer material is not limited thereto.

In another embodiment, the first substrate SUB1 may include glass, quartz, or the like.

The first substrate SUB may have a thickness of about 10 micrometers.

The first barrier layer BA1 may be disposed on the first substrate SUB1. The first barrier layer BA1 may cover the first substrate SUB1. The first barrier layer BA1 may prevent diffusion of impurity ions and may prevent penetration of moisture or air. The first barrier layer BA1 may include an inorganic material. Examples of the inorganic material may include silicon oxide (SiOx), silicon nitride (SiNx), and silicon oxynitride (SiOxNy). These may be used alone or in combination with each other.

Although not illustrated, the first barrier layer BA1 may include a lower barrier layer and an upper barrier layer. The lower barrier layer may include silicon oxide. The upper barrier layer may be disposed on the lower barrier layer, and may include silicon nitride. The lower barrier layer may have a thickness of approximately 6000 angstroms. The upper barrier layer may have a thickness of approximately 150 angstroms.

The second substrate SUB2 may be disposed on the first barrier layer BA1. The second substrate SUB2 may include substantially the same material as the first substrate SUB1. The second substrate SUB2 may have a thickness of about 5 micrometers to about 6 micrometers. For example, the second substrate SUB2 may have a thickness of approximately 5.8 micrometers.

The second barrier layer BA2 may be disposed on the second substrate SUB2. The second barrier layer BA2 may include substantially the same material as the first barrier layer BA1. For example, the second barrier layer BA2 may include silicon oxide. The second barrier layer BA2 may have a thickness of about 5000 angstroms.

The buffer layer BF may be disposed on the second barrier layer BA2. The buffer layer BF may cover the second barrier layer BA2. In an embodiment, the buffer layer BF may include silicon nitride. However, the material included in the buffer layer BF is not limited thereto, and the buffer layer BF may include silicon oxide, silicon oxynitride, or the like. The buffer layer BF may have a thickness of about 350 angstroms. The buffer layer BF may prevent metal atoms or impurities from diffusing into the semiconductor layer ACT. Also, the buffer layer BF may control the rate of heat provided to the semiconductor layer ACT during a crystallization process for forming the semiconductor layer ACT.

The charge trap layer AI may be disposed on the buffer layer BF. The charge trap layer AI may include a first charge trap layer AI1 and a second charge trap layer AI2.

The first charge trap layer AI1 may include an inorganic material. In one embodiment, the first charge trap layer AI1 may include silicon oxide (SiOx). However, the inorganic material is not limited to silicon oxide, and may be silicon nitride, silicon oxynitride, or the like.

In an embodiment, when the first charge trap layer AI1 includes silicon oxide, a first oxygen atom content of the first charge trap layer AI1 may be about 55.27 at %, or about 54 at % to about 56 at %. A first silicon atom content of the first charge trap layer AI1 may be about 44.72 at %, or about 43 at % to about 45 at %.

In one embodiment, the first charge trap layer AI1 may have a first thickness t1 of about 2000 angstroms to about 3000 angstroms.

The second charge trap layer AI2 may be disposed on the first charge trap layer AI1. The second charge trap layer AI2 may contact the first charge trap layer AI1. The second charge trap layer AI2 may include an inorganic material. In an embodiment, the second charge trap layer AI2 may include silicon oxide. However, the inorganic material is not limited to silicon oxide, and may be silicon nitride, silicon oxynitride, or the like.

In an embodiment, when the second charge trap layer AI2 includes silicon oxide, a second oxygen atom content of the second charge trap layer AI2 may be about 50.14 at %, or about 49 at % to about 51 at %. A second silicon atoms content of the second charge trap layer AI2 may be about 49.85 at %, or about 48 at % to about 50 at %.

In an embodiment, a difference between the first oxygen atoms content of the first charge trap layer AI1 and the second oxygen atoms content of the second charge trap layer AI2 may be about 5.13 at %, or about 4 at % to about 6 at %.

In an embodiment, the second charge trap layer AI2 may have a second thickness t2 of about 500 angstroms to about 1500 angstroms.

In an embodiment, a sum of the first thickness t1 of the first charge trap layer AI1 and the second thickness t2 of the second charge trap layer AI2 may be approximately 3500 angstroms. That is, the thickness of the charge trap layer AI may be approximately 3500 angstroms. For example, when the first thickness t1 of the first charge trap layer AI1 is approximately 2000 angstroms, the second thickness t2 of the second charge trap layer AI2 may be approximately 1500 angstroms. As another example, when the first thickness t1 of the first charge trap layer AI1 is approximately 3000 angstroms, the second thickness t2 of the second charge trap layer AI2 may be approximately 500 angstroms.

When the charge trap layer AI includes silicon oxide, the charge trap layer AI may be formed by chemical vapor deposition. The charge trap layer AI may be formed by adjusting the input amounts of nitrous oxide ($N_2O$) and silane ($SiH_4$). Accordingly, the charge trap layer AI may include a hydrogen atom (H) and a nitrogen atom (N) in addition to an oxygen atom (O) and a silicon atom (Si).

When the first charge trap layer AI1 includes silicon oxide, a first ratio of a N—H bond in the first charge trap layer AI1 may be about 0.3 at % or less, or about 0.1 at % to about 0.2 at %. However, the first ratio of the N—H bond in the first charge trap layer AI1 is not limited thereto. Here, the "ratio of the N—H bond" may mean the proportion of bonds between a nitrogen atom (N) and a hydrogen atom (H) out of all the chemical bonds. The first ratio of the N—H bond may be analyzed through a Fourier transform infrared spectrometer (FT-IR spectrometer).

In one embodiment, when the second charge trap layer AI2 includes silicon oxide, a ratio of a second N—H bond of the second charge trap layer AI2 is about 0.7 at % to about 1.0 at %, or about 0.7 at % to about 0.8 at %. However, the ratio of the second N—H bond of the second charge trap layer AI2 is not limited thereto.

In one embodiment, the second ratio of the N—H bond in the second charge trap layer AI2 may be greater than the first ratio of the N—H bond in the first charge trap layer AI1. A detailed description thereof will be given later.

In one embodiment, the second charge trap layer AI2 may be in contact with the semiconductor layer ACT.

A nitrogen atom (N) may be disposed at an interface between the charge trap layer AI and the semiconductor layer ACT. The nitrogen atom (N) positioned at the interface may have an outermost electron that is not bonded to other atoms. Some of the outermost electrons of the nitrogen atom (N) positioned at the interface may have a tendency to be stabilized by binding to the external electrons (–). That is, as the number of nitrogen atoms (N) positioned at the interface increases, more electrons (–) may be trapped in the charge trap layer AI. Accordingly, when the ratio of N—H bond of the charge trap layer AI has the above-described value or is within the above-described range, the amount of charge trapping in the charge trap layer AI may increase.

The charge trap layer AI improves element characteristics of the first transistor TR1. Specifically, a driving range of the first transistor TR1 may increase. That is, with the charge trap layer AI present, a relatively large driving current may flow through the first transistor TR1 to which the same data voltage is applied. The higher current flow improves a luminance of the display device 1000 (refer to FIG. 1) and a long-term afterimage issue. A detailed description thereof will be given below.

As the first ratio of the N—H bond, the first oxygen atom content, the first silicon atom content, the second ratio of the N—H bond, the second oxygen atom content, and/or the second silicon atom content have the above-mentioned values or are within the above-described ranges, the element characteristics of the first transistor TR1 may be improved. For example, when the first ratio of the N—H bond, the first oxygen atom content, the first silicon atom content, the second ratio of the N—H bond, the second oxygen atom content, and/or the second silicon atom content are lower than the above-described range, the improvement of the device characteristics of the first transistor TR1 may not be significant, and when the first ratio of the N—H bond, the first oxygen atom content, the first silicon atom content, the second ratio of the N—H bond, the second oxygen atom content, and/or the second silicon atom contentare larger than the above-described range, the charge trap layer AI may not be smoothly formed.

The semiconductor layer ACT may be disposed on the charge trap layer AI. The semiconductor layer ACT may be in contact with the second charge trap layer AI2. The semiconductor layer ACT may include a first active pattern ACT1 and a second active pattern ACT2. In an embodiment, the first active pattern ACT1 and the second active pattern ACT2 may include polycrystalline silicon. In another embodiment, the first active pattern ACT1 may include polycrystalline silicon, and the second active pattern ACT2 may include an oxide semiconductor. However, the present invention is not limited thereto, and the semiconductor layer ACT may include amorphous silicon.

The gate insulating layer GI may be disposed on the semiconductor layer ACT and may cover the semiconductor layer ACT. The gate insulating layer GI may include an inorganic material. Examples of the inorganic material may include silicon oxide, silicon nitride, and silicon oxynitride. These may be used alone or in combination with each other.

The first gate electrode GAT1 and the second gate electrode GAT2 may be disposed on the gate insulating layer GI. The first gate electrode GAT1 may overlap the first active pattern ACT1, and the second gate electrode GAT2 may overlap the second active pattern ACT2. The first gate electrode GAT1 and the second gate electrode GAT2 may include a metal, a metal oxide, or a metal nitride. Examples of the metal include silver, molybdenum, aluminum, tungsten, copper, nickel, chromium, titanium, tantalum, platinum, and scandium. These may be used alone or in combination with each other. Examples of the metal oxide include indium tin oxide (ITO), indium zinc oxide (IZO), and the like. These may be used alone or in combination with each other. Examples of the metal nitride include aluminum nitride, tungsten nitride, and chromium nitride. These may be used alone or in combination with each other.

The interlayer insulating layer ILD may be disposed on the first gate electrode GAT1 and the second gate electrode GAT2, and may cover the first gate electrode GAT1 and the second gate electrode GAT2. The interlayer insulating layer ILD may include an inorganic material.

The first and second source electrodes SE1 and SE2 and the first and second drain electrodes DE1 and DE2 may be disposed on the interlayer insulating layer ILD. Each of the first and second source electrodes SE1 and SE2 and the first and second drain electrodes DE1 and DE2 may be connected to the semiconductor layer ACT through a contact hole. For example, the first drain electrode DE1 may be connected to the first active pattern ACT1. Each of the first and second source electrodes SE1 and SE2 and each of the first and second drain electrodes DE1 and DE2 may include a metal, a metal oxide, or a metal nitride.

The via insulating layer VIA may be disposed on the first and second source electrodes SE1 and SE2 and the first and second drain electrodes DE1 and DE2. The via insulating layer VIA may cover the first and second source electrodes SE1 and SE2 and the first and second drain electrodes DE1 and DE2. The via insulating layer VIA may have a substantially flat top surface. The via insulating layer VIA may include an organic material. Examples of the organic material include photoresists, polyacrylic resins, and polyimide resins. These may be used alone or in combination with each other.

The pixel electrode ANO may be disposed on the via insulating layer VIA. The pixel electrode ANO may be connected to the first drain electrode DE1 through a contact hole. Accordingly, the pixel electrode ANO may be electrically connected to the first active pattern ACT1 of the semiconductor layer ACT through the first drain electrode DE1. The pixel electrode ANO may include a metal, a metal oxide, or a metal nitride. For example, the pixel electrode ANO may be an anode electrode. As another example, the pixel electrode ANO may be a cathode electrode.

The pixel defining layer PDL may be disposed on the via insulating layer VIA and the pixel electrode ANO. The pixel defining layer PDL may cover ends of the pixel electrode ANO. The pixel defining layer PDL may expose the pixel electrode ANO through the opening OP. In an embodiment, at least a portion of the pixel defining layer PDL may overlap the semiconductor layer ACT. For example, the pixel defining layer PDL may have a transparent color (e.g., yellow).

The intermediate layer ML may be disposed on the pixel electrode ANO. The intermediate layer ML may be disposed in the opening OP of the pixel defining layer PDL. The intermediate layer ML may include a hole injection layer, a hole transport layer, a light emitting layer, an electron transport layer, and an electron injection layer. The light emitting layer may include an organic material emitting light of a preset color. The organic material may emit the light based on a potential difference between the pixel electrode ANO and the common electrode CAT.

The common electrode CAT may be disposed on the intermediate layer ML. The common electrode CAT may cover the pixel defining layer PDL. The common electrode CAT may include a transparent conductive material. For example, the common electrode CAT may be a cathode electrode. As another example, the common electrode CAT may be an anode electrode.

Although it has been described that the light emitting element LED included in the display device 1000 includes the pixel electrode ANO, the intermediate layer ML, and the common electrode CAT, the present disclosure is not limited thereto. For example, the light emitting element LED may include a micro light emitting diode, a nano light emitting diode, a quantum dot, a quantum rod, and the like.

The thin film encapsulation layer TFE may be disposed on the common electrode CAT. The thin film encapsulation layer TFE may protect the light emitting element LED from external moisture, heat, impact, and the like. The thin film encapsulation layer TFE may include an inorganic layer and an organic layer that are alternately disposed.

Figure 3:
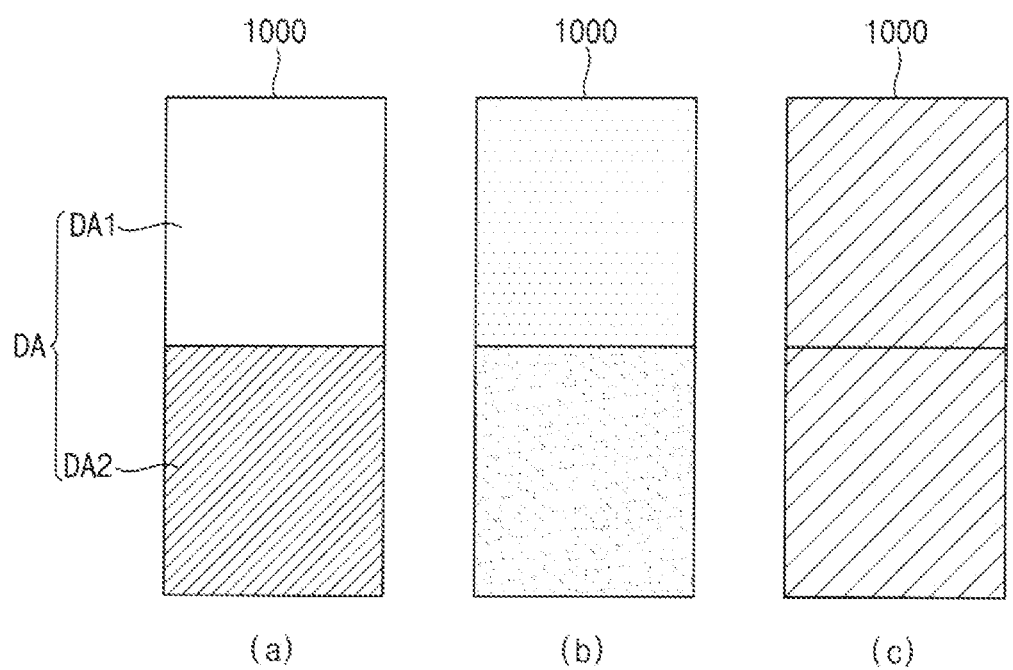
FIGS. 3 and 4 depict an afterimage of a display device.
Figure 4:
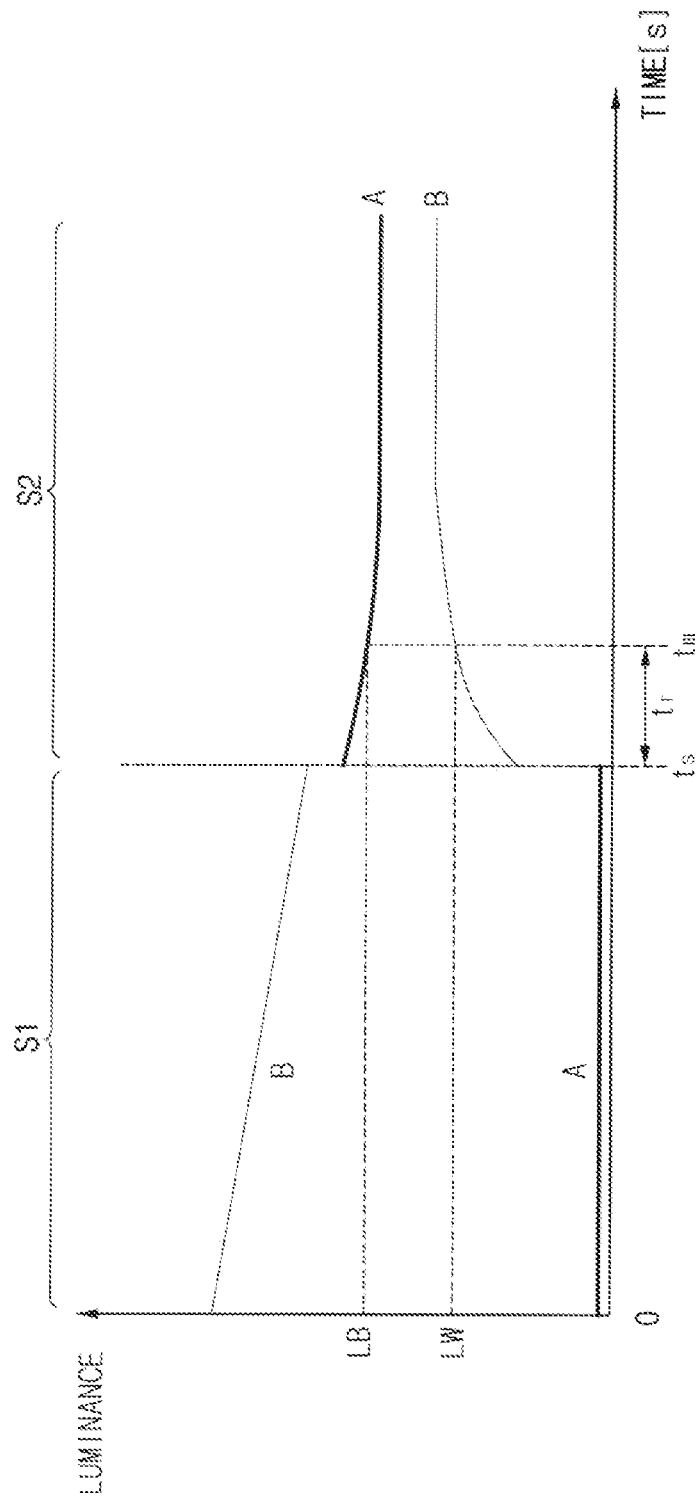

FIGS. 3 and 4 are views for describing an afterimage of a display device. An X-axis of the graph of FIG. 4 represents time, and a Y-axis of the graph of FIG. 4 represents a luminance of each of the first area DA1 and the second area DA2 of FIG. 3.

Referring to FIG. 3, the display area DA (refer to FIG. 1) of the display device 1000 may include a first area DA1 and a second area DA2 adjacent to the first area DA1.

Referring to FIGS. 3 and 4, line A represents the luminance of the second area DA2 of FIG. 3 according to time. Line B represents the luminance of the first area DA1 of FIG. 3 according to time.

Referring to FIGS. 3 (*a*) and 4, in the graphs of A and B, at the stress time ts, the first area DA1 may display a white pattern, and the second area DA2 may display a black pattern. A section before the stress time ts may be referred to as a stress period 51. For example, the stress time ts may be about 3 minutes to about 30 minutes.

In the stress period 51, the first area DA1 may receive a signal to display a white pattern. The luminance of the first area DA1 may decrease with time.

Referring to FIGS. 3 (*b*) and 4, at the stress time ts, the first area DA1 and the second area DA2 may receive a signal to display a gray pattern. For example, the signal may cause the first area DA1 and the second area DA2 to display a 31 gray pattern. However, the first area DA1 and the second area DA2 may display different patterns at the stress time ts when the signal is received.

Referring to FIGS. 3 (*c*) and 4, a period following the stress time ts may be referred to as a monitoring period S2. During the monitoring period S2, the luminance of the first area DA1 and the luminance of the second area DA2 may be different from each other. As a result, an afterimage may occur. The long-term afterimage may mean an afterimage generated when the stress time ts is about 3 minutes to about 30 minutes.

During the monitoring period S2, the luminance of the first area DA1 may gradually increase as time passes, and the luminance of the second area DA2 may gradually decrease as time passes. For example, the luminance of the first area DA1 and the luminance of the second area DA2 may approach a gray pattern (e.g., a 31 gray pattern) as time passes.

The monitoring time tm may be a point in time when the release period tr has elapsed from the stress time ts. At the monitoring time tm, the first area DA1 may display a first luminance LW, and the second area DA2 may display a second luminance LB.

At the monitoring time tm, a degree of afterimage TCR may be defined by the first luminance LW and the second luminance LB. For example, the degree of afterimage TCR may be defined in the monitoring time tm when the stress time ts is about 3 minutes to about 30 minutes and the release period tr is about 0 seconds to about 300 seconds. Accordingly, the degree of afterimage TCR may be a metric for determining improvement of the long-term afterimage. The degree of afterimage TCR may be defined by Equation below.

$$TCR = \frac{LB - LW}{LB + LW} \times 100(\%) \qquad <\text{Equation}>$$

A high absolute value of afterimage TCR indicates that the long-term afterimage may be present. A low absolute value of afterimage TCR indicates that there is no long-term afterimage. That is, as the degree of afterimage TCR approaches 0, long-term afterimage is less likely to be a problem. For example, when the difference between the first luminance LW and the second luminance LB is relatively large, the long-term afterimage may remain problematic. When the difference between the first luminance LW and the second luminance LB is relatively small, the long-term afterimage may not exist.

Figure 5:
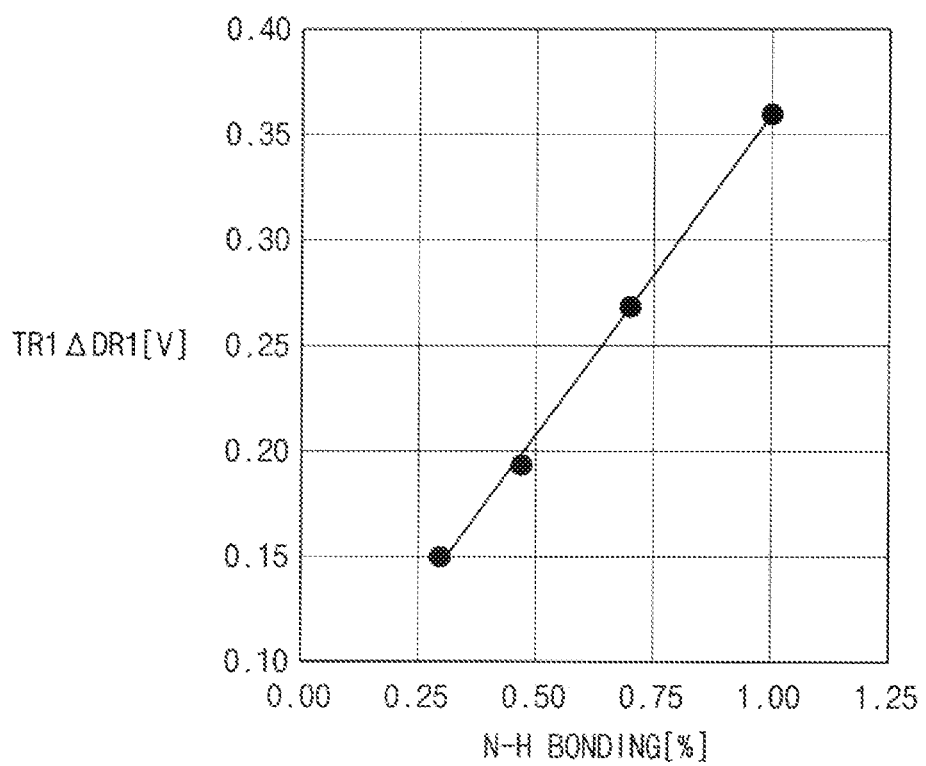
FIG. 5 is a graph illustrating a change amount of a driving range of a first transistor according to a ratio of N—H bonds of a charge trap layer.

FIG. 5 is a graph illustrating a change amount of a driving range of a first transistor according to a ratio of N—H bonds of a charge trap layer. In the graph of FIG. 5, a X-axis represents a ratio of N—H bond of the charge trap layer AI, and a Y-axis represents a change amount ΔDR1 of a driving range of the first transistor TR1.

Referring to FIG. 5, when the ratio of N—H bond in the charge trap layer AI is about 0.3, the change amount ΔDR1 of the driving range of the first transistor TR1 may be about 0.15. When the ratio of N—H bond of the charge trap layer AI is about 0.5, the change amount ΔDR1 in the driving range of the first transistor TR1 may be about 0.20. When the ratio of N—H bond in the charge trap layer AI is about 0.7, the change amount ΔDR1 in the driving range of the first transistor TR1 may be about 0.27. When ratio of N—H bond in the charge trap layer AI is about 1.0, the change amount ΔDR1 of the driving range of the first transistor TR1 may be about 0.36. That is, as the ratio of N—H bond in the charge trap layer AI increases, the change amount ΔDR1 in the driving range of the first transistor TR1 may increase.

Figure 6:
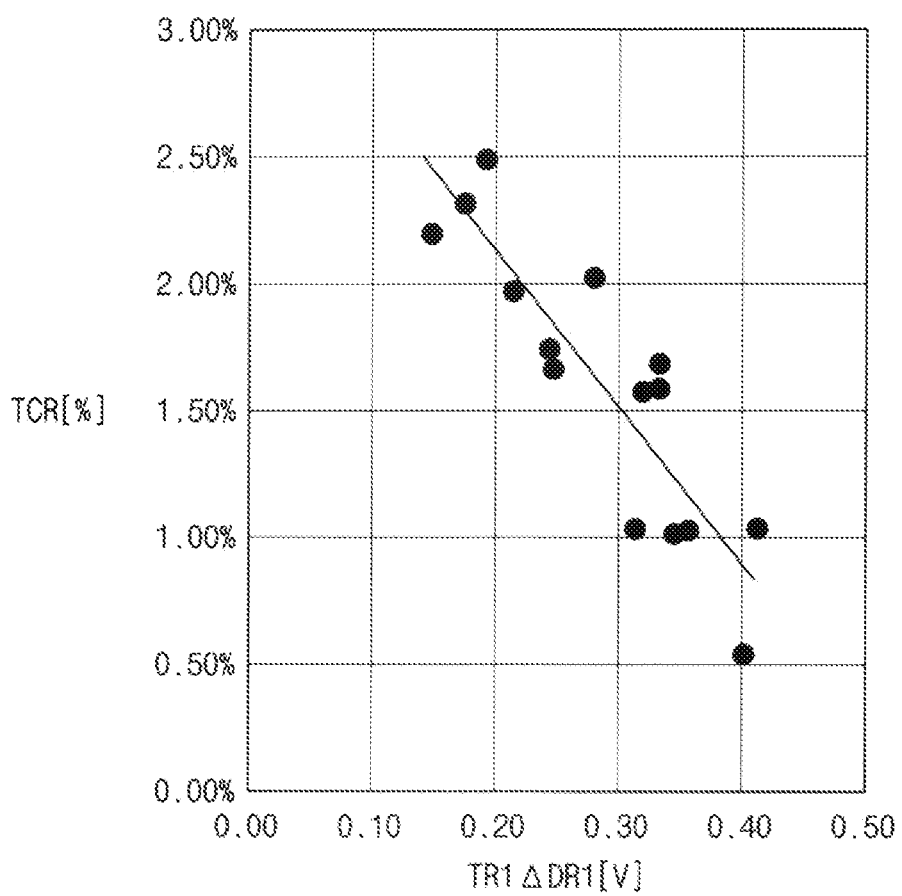
FIG. 6 is a graph illustrating a degree of an afterimage according to an amount of change in a driving range of a first transistor.

FIG. 6 is a graph illustrating a degree of an afterimage according to an amount of change in a driving range of a first transistor. In the graph of FIG. 6, an X-axis represents the change amount ΔDR1 in the driving range of the first transistor TR1, and a Y-axis represents the degree of afterimage TCR.

Referring to FIG. 6, the graph of FIG. 6 represents the degree of afterimage TCR when the stress time ts is 30 minutes and the release period tr is 300 seconds. That is, the improvement of the long-term afterimage may be judged by the degree of afterimage TCR of the graph of FIG. 6.

When the change amount ΔDR1 of the driving range of the first transistor TR1 is about 0.15, the degree of afterimage TCR may be about 2.3. When the change amount ΔDR1 of the driving range of the first transistor TR1 is approximately 0.2, the degree of afterimage TCR may be approximately 2.1. When the change amount ΔDR1 of the driving range of the first transistor TR1 is about 0.25, the degree of afterimage TCR may be about 1.7. When the change amount ΔDR1 of the driving range of the first transistor TR1 is about 0.3, the degree of afterimage TCR may be about 1.5. When the change amount ΔDR1 of the driving range of the first transistor TR1 is about 0.35, the degree of afterimage TCR may be about 1.2. When the change amount ΔDR1 of the driving range of the first transistor TR1 is about 0.4, the degree of afterimage TCR may be about 0.8. That is, as the change amount ΔDR1 in the driving range of the first transistor TR1 increases, the degree of afterimage TCR decreases. Accordingly, as the change amount ΔDR of the driving range of the first transistor TR1 increases, the long-term afterimage issue may be improved. The improvement of the long-term afterimage is not affected when the stress time ts is 30 minutes and the release period tr is 300 seconds. For example, even when the stress time ts is from about 3 minutes to about 30 minutes and the release period tr is from about 0 seconds to about 300 seconds, as the change amount ΔDR1 in the driving range increases, the long-term afterimage may be improved.

Referring to FIGS. 5 and 6, as the ratio of N—H bond in the charge trap layer AI increases, the degree of afterimage TCR may decrease. That is, as the ratio of N—H bond in the charge trap layer AI increases, the long-term afterimage may be improved.

Figure 7:
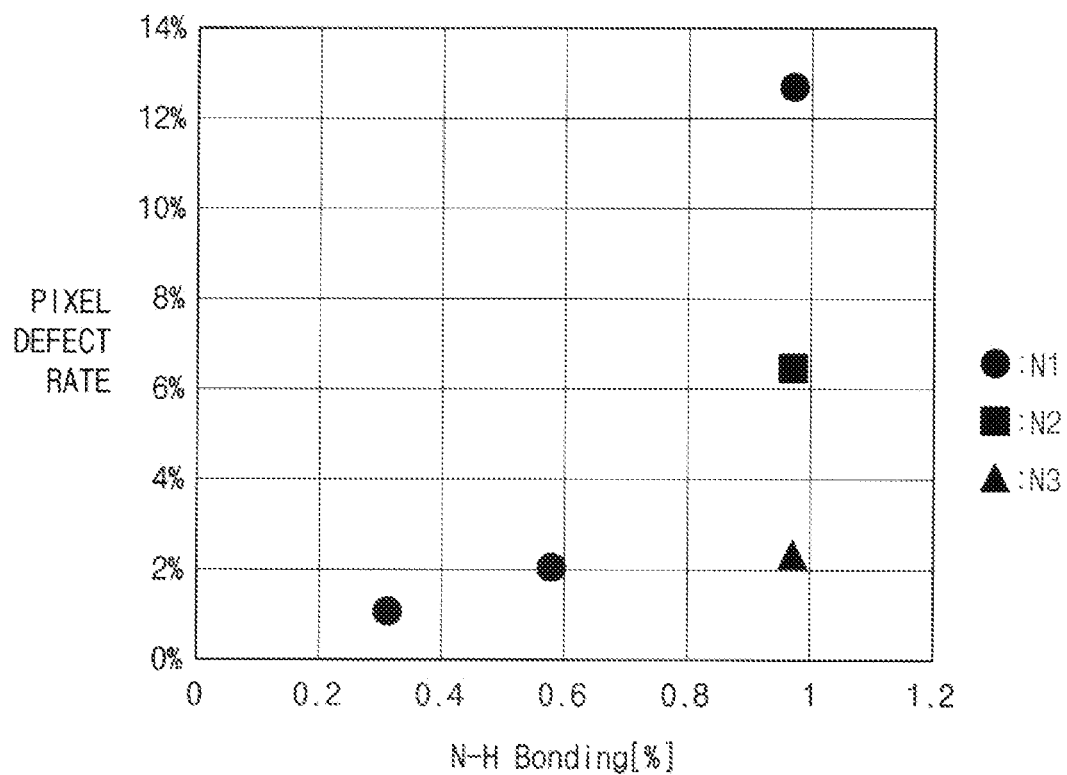
FIG. 7 is a graph illustrating a pixel defect rate according to a ratio of N—H bonds of a charge trap layer.

FIG. 7 is a graph illustrating a pixel defect rate according to a ratio of N—H bond of a charge trap layer. In the graph of FIG. 7, an X-axis represents the ratio of N—H bond of the charge trap layer AI, and a Y-axis represents a defective rate of the pixel PX (refer to FIG. 1).

Referring to FIG. 7, a graph of N1 represents a case in which the charge trap layer AI has a uniform ratio of N—H bond. That is, the graph of N1 represents a case in which the charge trap layer AI is not divided into the first charge trap layer AI1 and the second charge trap layer AI2. In the graph of N1, the charge trap layer AI may have a thickness of approximately 3500 angstroms.

In the graph of N1, when the charge trap layer AI has a ratio of N—H bond of about 0.3 at % to about 0.6 at %, the defective rate of the pixel PX (refer to FIG. 1) is relatively low. However, when the charge trap layer AI has the ratio of N—H bond of about 1.0 at %, the defective rate of the pixel PX becomes higher. Accordingly, although the long-term afterimage is improved as the ratio of N—H bond in the charge trap layer AI increases, it is necessary to reduce the defective rate of the pixel PX.

A graph of N2 and a graph of N3 represent a case in which the charge trap layer AI has the first charge trap layer AI1 having a first ratio of N—H bond and the second charge trap layer AI2 having a second ratio greater than the first ratio of the first N—H bond. The first ratio of the N—H bond may be about 0.3 at % or less. The second ratio of the N—H bond may be about 0.7 at % to about 1.0 at %.

In the graph of N2, the first charge trap layer AI1 has a first thickness t1 of approximately 2000 angstroms (refer to FIG. 2), and the second charge trap layer AI2 has a second thickness t2 of approximately 1500 angstroms (refer to FIG. 2). In this case, the ratio of N—H bond of the charge trap layer AI including the first charge trap layer AI1 and the second charge trap layer AI2 may be about 1.0 at %.

Comparing the graph of N1 and the graph of N2, even if the charge trap layer AI has a ratio of N—H bond of approximately 1.0 at %, the defective rate of the pixel PX in the graph of N2 is less than the defective rate of the pixel PX in the graph of N1. That is, when the charge trap layer AI including the first charge trap layer AI1 having the first ratio of the N—H bond and the second charge trap layer AI2 having the second ratio of the N—H bond N2 (refer to the graph of N2) are used, the defective rate of the pixel PX may decrease.

In the graph of N3, the first charge trap layer AI1 has the first thickness t1 of about 3000 angstroms (refer to FIG. 2), and the second charge trap layer AI2 has a second thickness t2 of about 500 angstroms (refer to FIG. 2). In this case, the ratio of N—H bond of the charge trap layer AI including the first charge trap layer AI1 and the second charge trap layer AI2 may be about 1.0 at %.

Comparing the graph of N1 and the graph of N3, even if the charge trap layer AI has a ratio of N—H bond of about 1.0 at %, the defective rate of the pixel PX in the graph of N3 is less than the defective rate of the pixel PX in the graph of N1. That is, when the charge trap layer AI includes a first charge trap layer AI1 having a first NH bond ratio and a second charge trap layer AI2 having the second NH bond ratio (N2) graph), the defective rate of the pixel PX may decrease.

Comparing the graph of N2 and the graph of N3, when the first charge trap layer AI1 has the first thickness t1 of about 3000 angstroms (graph of N3), the defective rate of the pixel PX is lower than when the first charge trap layer AI1 has the first thickness t1 of 2000 angstroms (graph of N2).

When the first ratio of the N—H bond, the second ratio of the N—H bond, the first thickness t1, and the second thickness t2 are within the above-described ranges, the ratio of the N—H bond of the charge trap film AI may increase, and at the same time, the defective rate of the pixel PX may decrease. That is, when the ratio of the N—H bond of the charge trap layer AI approaches about 1.0 at %, the degree of afterimage TCR may be reduced and the long-term afterimage may be improved. At the same time, the defective rate of the pixel PX may be reduced.

When the first ratio of the N—H bond, the second ratio of the N—H bond, the first thickness t1, and the second thickness t2 are outside the above-described ranges, the ratio of the N—H bond of the charge trap layer AI may not increase. Alternatively, the defective rate of the pixel PX may increase even if the ratio of N—H bond of the charge trap layer AI increases. That is, the defect rate of the pixel PX may increase even if the long-term afterimage is improved, or the long-term afterimage is not improved.

Figure 8:
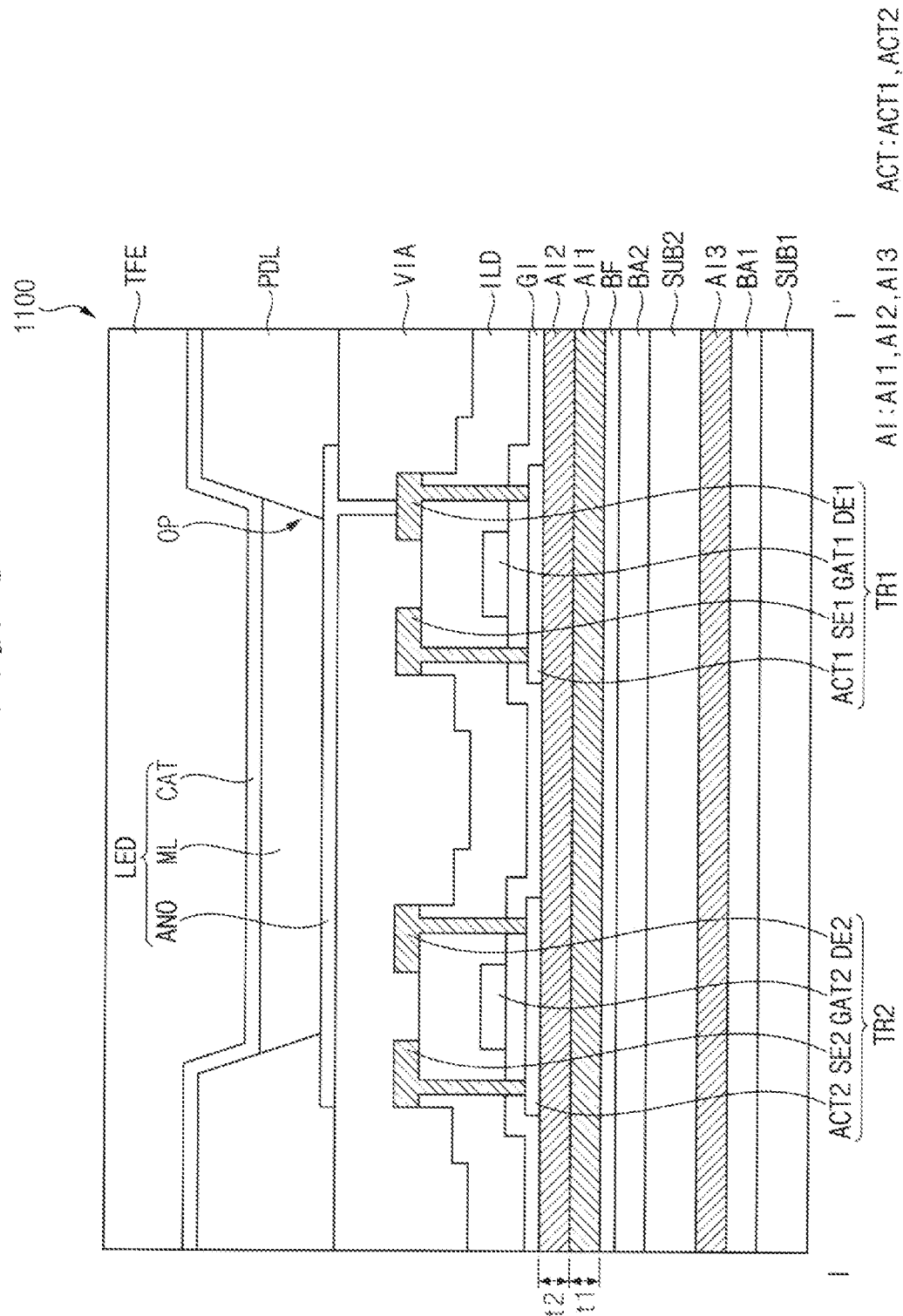
FIG. 8 is a cross-sectional view illustrating a display device according to another embodiment.

FIG. 8 is a cross-sectional view illustrating a display device according to another embodiment.

Referring to FIG. 8, a display device 1100 according to another embodiment may be substantially the same as the display device 1000 described with reference to FIG. 2 except for a third charge trap layer AI3. Accordingly, overlapping descriptions will be omitted.

The charge trap layer AI may include a first charge trap layer AI1, a second charge trap layer AI2, and a third charge trap layer AI3.

In an embodiment, the third charge trap layer AI3 may be disposed between the first barrier layer BA1 and the second substrate SUB2.

The third charge trap layer AI3 may include an inorganic material. In an embodiment, the third charge trap layer AI3 may include silicon nitride (SiNx). However, the inorganic material is not limited to silicon nitride, and may be silicon oxide, silicon oxynitride, or the like.

The third charge trap layer AI3 may serve to more firmly bond the first substrate SUB1 and the second substrate SUB2 to each other.

The third charge trap layer AI3 may be formed by chemical vapor deposition (CVD). When the third charge trap layer AI3 includes silicon nitride, the third charge trap layer AI3 may be formed under an ammonia-free ($NH_3$ free) condition. For example, the third charge trap layer AI3 may be formed by adjusting the input amounts of nitrogen ($N_2$) and silane ($SiH_4$). The third charge trap layer AI3 may include a hydrogen atom (H) in addition to a nitrogen atom (N) and a silicon atom (Si). In this case, ammonia ($NH_3$) may not be added.

When the third charge trap layer AI3 is formed in an ammonia-free condition, the refractive index of the third charge trap layer AI3 may be about 2.7774, about 2.3 to about 3.0, or about 2.0 to about 3.5, but is not limited thereto.

When the third charge trap layer AI3 includes silicon nitride, the ratio of N—H bond in the third charge trap layer AI3 may be about 1.05 at %, or about 1 at % to about 5 at %, or about 0.1 at % to about 15 at %. However, the ratio of the N—H bond of the third charge trap layer AI3 is not limited thereto.

The ratio of Si—H bond of the third charge trap layer AI3 may be about 10.02 at %, about 8 at % to about 12 at %, or about 8 at % to about 15 at %. However, the ratio of the Si—H bond of the third charge trap layer AI3 is not limited thereto. Here, the ratio of Si—H bond may mean a ratio of bonds in which a silicon atom (Si) and a hydrogen atom (H) are bonded among all bonds.

The ratio of the Si—H bond in the third charge trap layer AI3 to the ratio of the N—H bond in the third charge trap layer AI3 ([Si—H]/[NH]) may be about 9.54, or about 8 to about 12, or from about 8 to about 15.

The ratio of N—H bond, the ratio of Si—H bond, and/or the ratio of Si—H bond to the ratio of N—H bond may be analyzed through a Fourier transform infrared spectrometer (FT-IR spectrometer).

The silicon atom content of the third charge trap layer AI3 may be approximately 65.05 at %, approximately 60 at % to approximately 70 at %, or approximately 50 at % to approximately 80 at %. The nitrogen atom content of the third charge trap layer AI3 may be about 31.85 at %, about 25 at % to about 35 at %, or about 20 at % to about 40 at %. The ratio of the silicon atom content of the third charge trap layer AI3 to the nitrogen atom content of the third charge trap layer AI3 may be about 2.04, about 1.6 to about 2.5, or about 1.1 to about 3.0.

The silicon atom content, the nitrogen atom content, and the ratio of the silicon atom content to the nitrogen atom content may be analyzed through energy dispersion x-ray spectrometry (EDS).

In this case, the element characteristics of the first transistor TR1 may be improved. Specifically, the driving range of the first transistor TR1 may increase. Accordingly, the luminance of the display device 1100 may be improved, and the long-term afterimage may be improved.

When the range is smaller than the above-mentioned range, the improvement in the element characteristics of the first transistor TR1 may not be significant, and when it is larger than the above-mentioned range, the third charge trap layer AI3 may not be smoothly formed.

Figure 9:
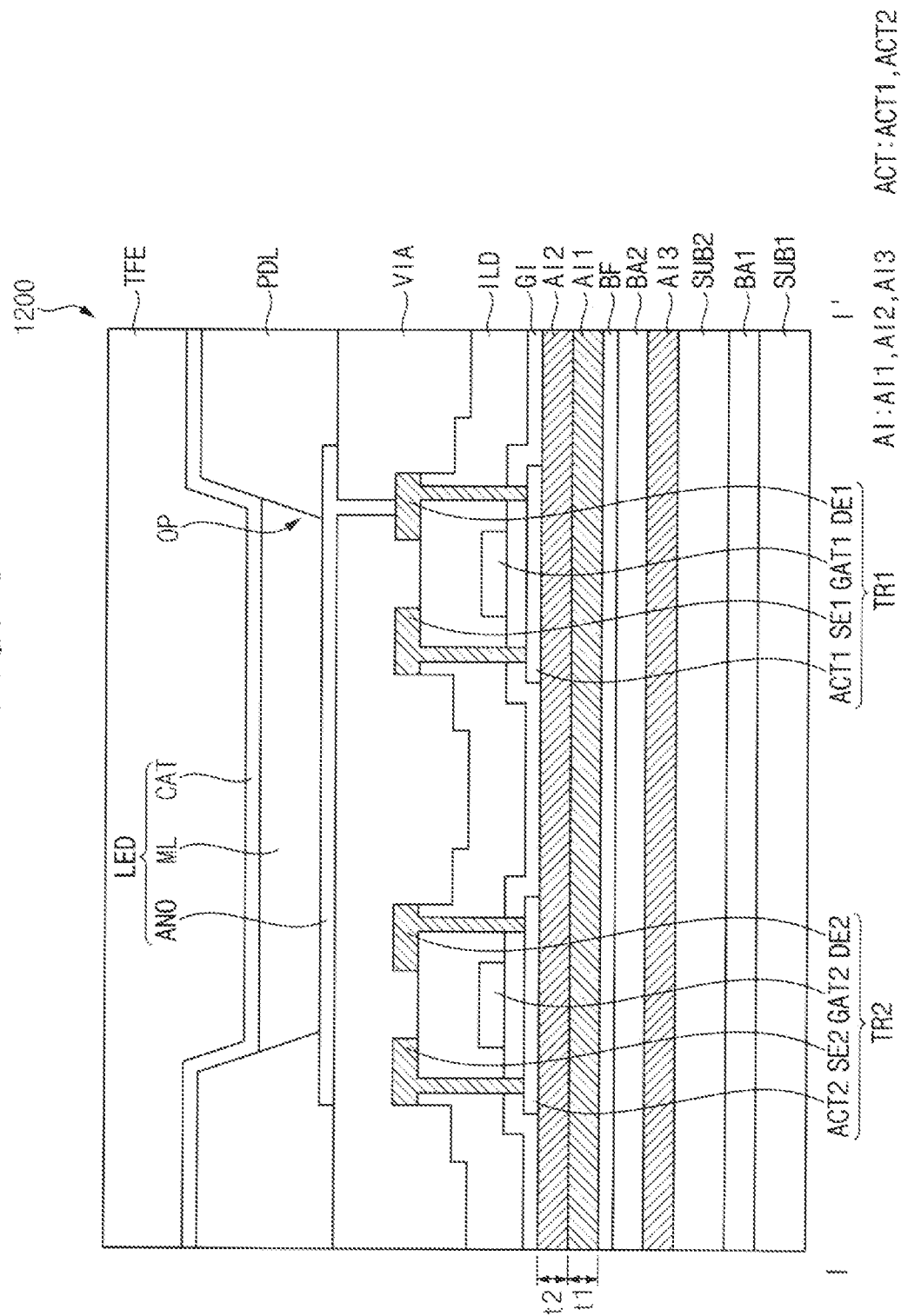
FIG. 9 is a cross-sectional view illustrating a display device according to still another embodiment.

FIG. 9 is a cross-sectional view illustrating a display device according to still another embodiment.

Referring to FIG. 9, a display device 1200 according to another embodiment may be substantially the same as the display device 1100 described with reference to FIG. 8 except for the position of the third charge trap layer AI3. Accordingly, overlapping descriptions will be omitted.

In an embodiment, the third charge trap layer AI3 may be disposed between the second substrate SUB2 and the second barrier layer BA2.

Even in this case, as the first charge trap layer AI1, the second charge trap layer AI2, and the third charge trap layer AI3 are disposed, device characteristics of the first transistor TR1 may be improved. Specifically, the driving range of the first transistor TR1 may increase. Accordingly, the luminance of the display device 1200 may be improved, and the long-term afterimage may be improved.

Figure 10:
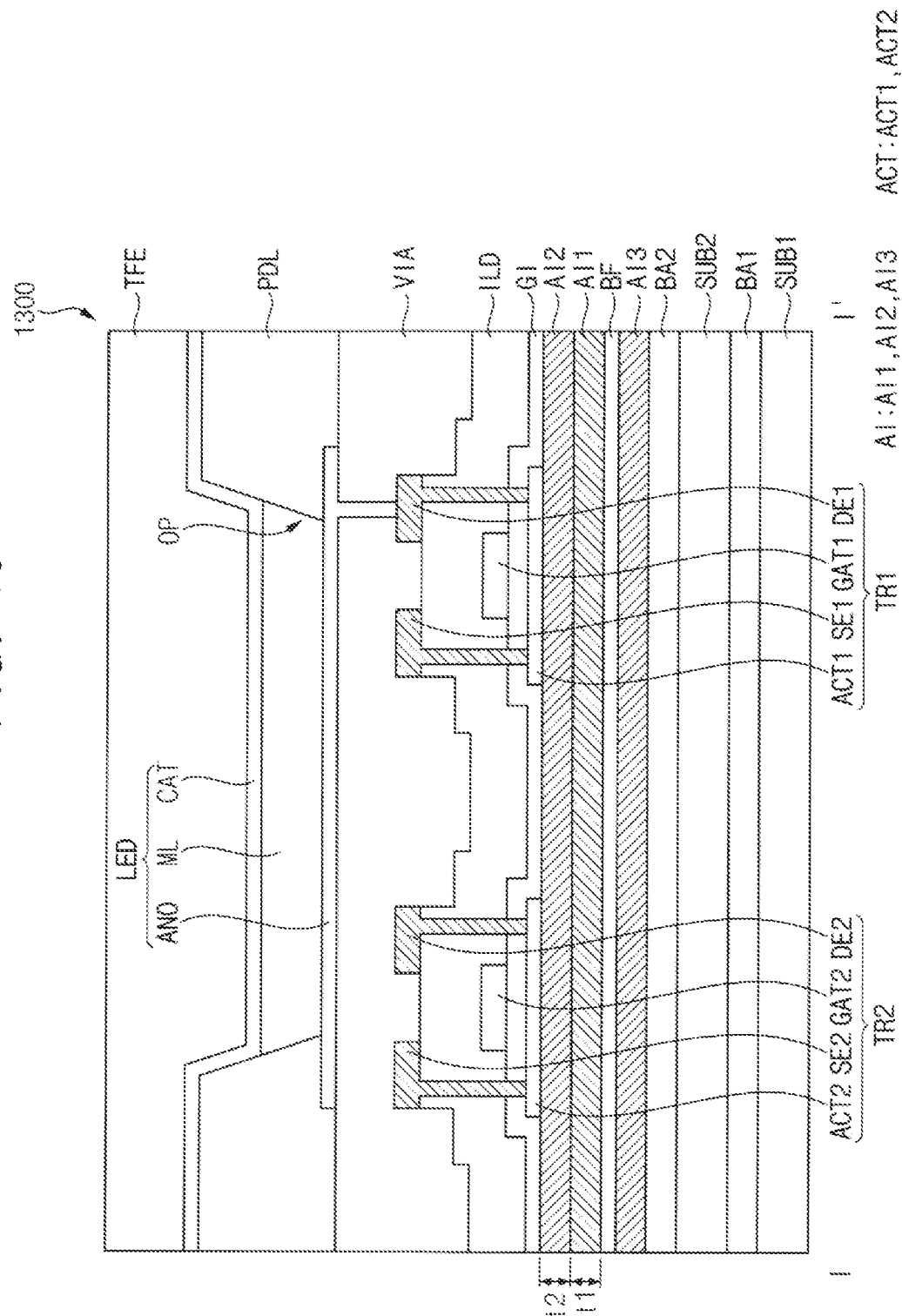
FIG. 10 is a cross-sectional view illustrating a display device according to still another embodiment.

FIG. 10 is a cross-sectional view illustrating a display device according to still another embodiment.

Referring to FIG. 10, a display device 1300 according to another embodiment of the present inventive concept may be substantially the same as the display device 1100 described with reference to FIG. 8 except for the position of the third charge trap layer AI3. Accordingly, overlapping descriptions will be omitted.

In an embodiment, the third charge trap layer AI3 may be disposed between the second barrier layer BA2 and the buffer layer BF.

Even in this case, as the first charge trap layer AI1, the second charge trap layer AI2, and the third charge trap layer AI3 are disposed, the element characteristics of the first transistor TR1 may be improved. Specifically, the driving range of the first transistor TR1 may increase. Accordingly, the luminance of the display device 1300 may be improved, and the long-term afterimage may be improved.

FIGS. 11, 12, 13 and 14 are cross-sectional views illustrating a display device according to still another embodiment.

Figure 11:
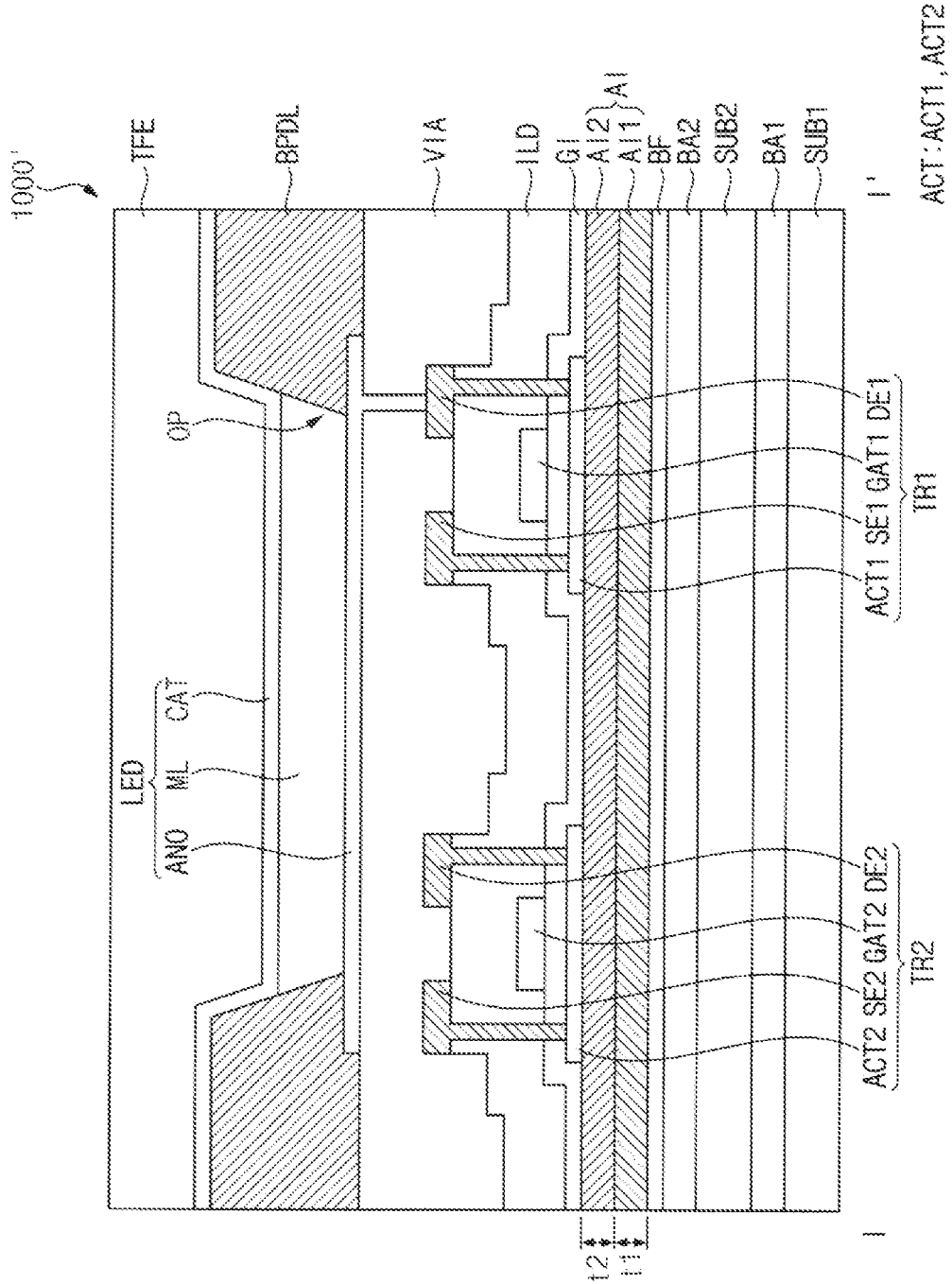
FIGS. 11, 12, 13 and 14 are cross-sectional views illustrating a display device according to still another embodiment.

Referring to FIG. 11, a display device 1000' according to still another embodiment may be substantially the same as the display device 1000 described with reference to FIG. 2, except for the pixel defining layer BPDL.

Figure 12:
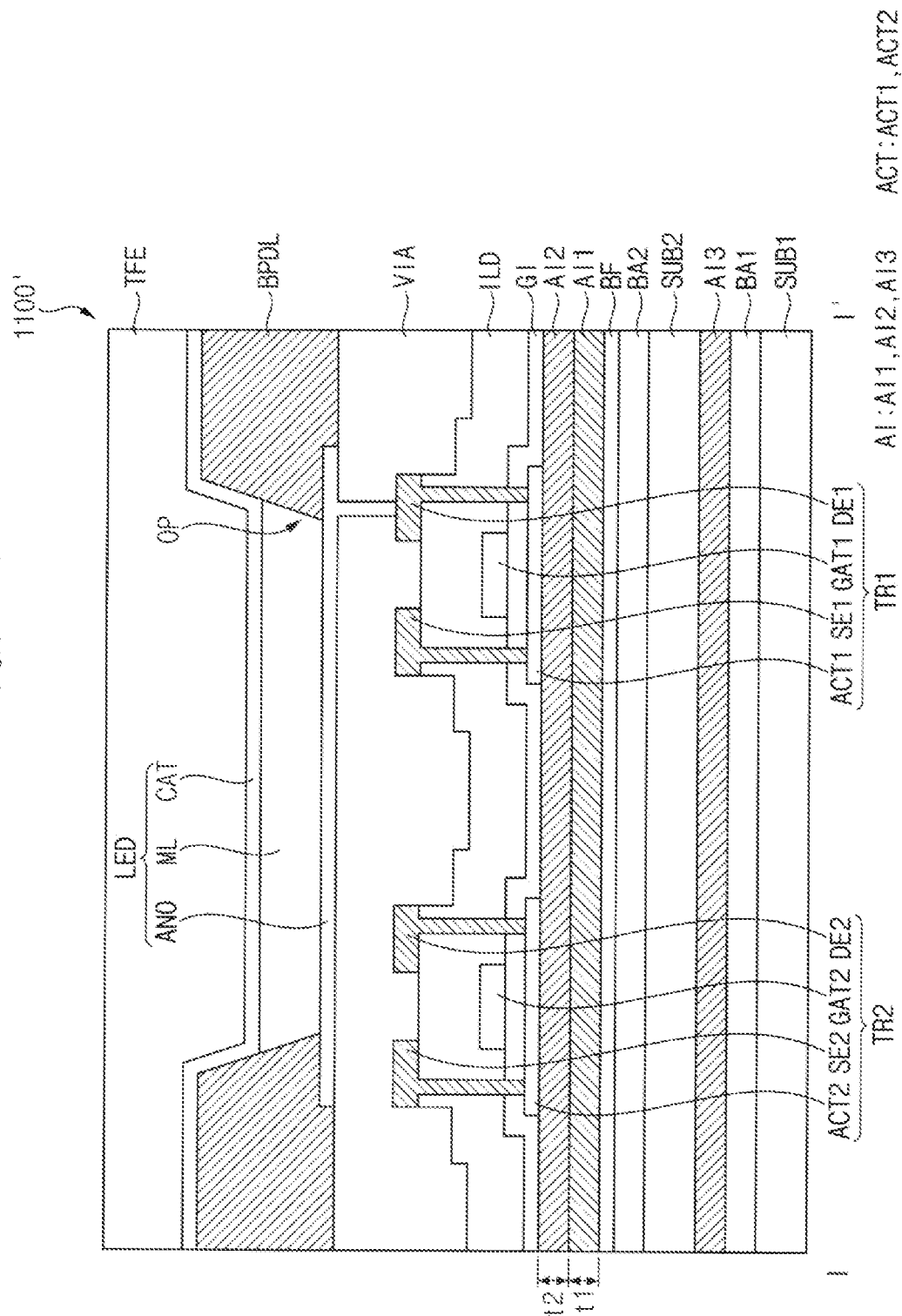

Referring to FIG. 12, a display device 1100' according to still another embodiment may be substantially the same as the display device 1100 described with reference to FIG. 8, except for the pixel defining layer BPDL.

Figure 13:
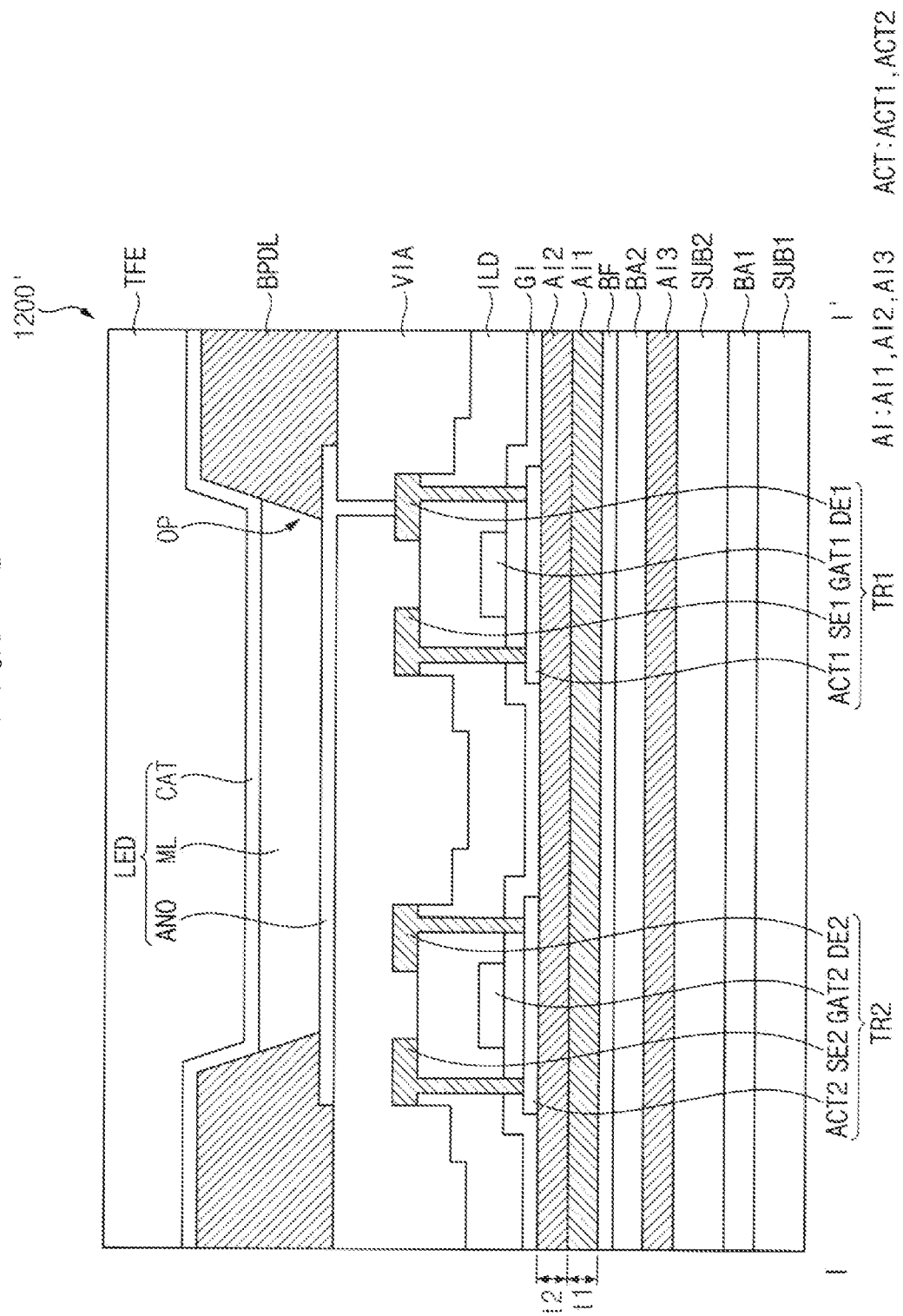

Referring to FIG. 13, a display device 1200' according to still another embodiment may be substantially the same as the display device 1200 described with reference to FIG. 9 except for the pixel defining layer BPDL.

Figure 14:
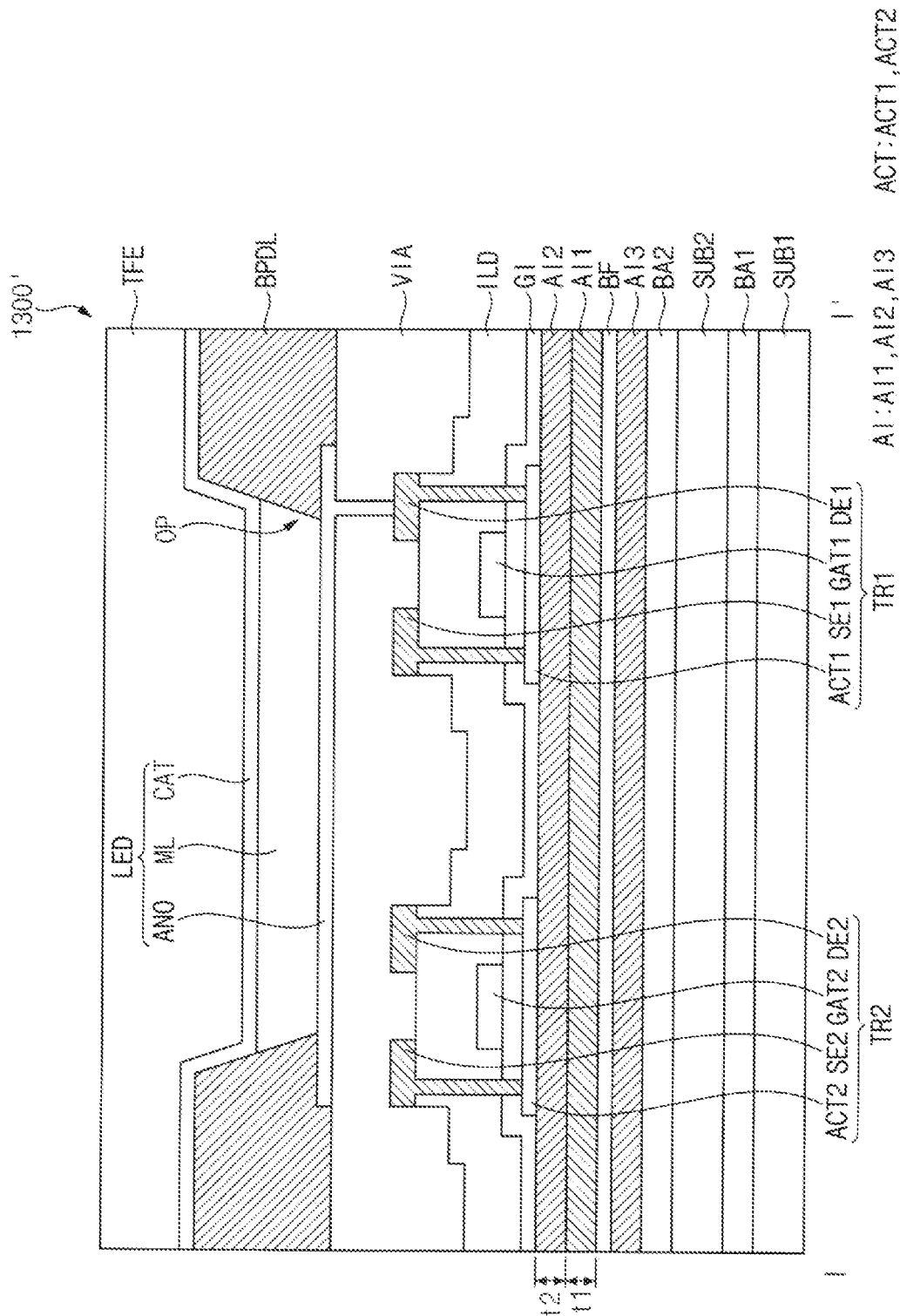

Referring to FIG. 14, a display device 1300' according to still another embodiment may be substantially the same as the display device 1300 described with reference to FIG. 10 except for the pixel defining layer BPDL.

Referring to FIGS. 11, 12, 13 and 14, display devices 1000', 1100', 1200', and 1300' according to still other embodiments of the present inventive concept may include a pixel defining layer BPDL having a black color.

In an embodiment, the pixel defining layer BPDL may absorb external light incident on the display devices 1000', 1100', 1200', and 1300'. For example, the pixel defining layer BPDL may absorb the external light to reduce the amount of the external light incident on the semiconductor layer ACT. The pixel defining layer BPDL may include a black pigment having a black color. Examples of the black pigment include carbon black. However, the black pigment is not limited thereto.

In an embodiment, the optical density OD of the pixel defining layer BPDL may be about 1. For example, about 10% of the external light incident on the pixel defining layer BPDL may pass through the pixel defining layer BPDL. However, the absorbance of the pixel defining layer BPDL is not limited thereto.

As the display devices 1000', 1100', 1200', and 1300' may include the pixel defining layer BPDL having a black color, the long-term afterimage may be further improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a first substrate;
a first barrier layer disposed on the first substrate;
a second substrate disposed on the first barrier layer;
a second barrier layer disposed on the second substrate;
a buffer layer disposed on the second barrier layer;
a first charge trap layer disposed on the buffer layer and including silicon oxide;
a second charge trap layer disposed on the first charge trap layer, the second charge trap layer including silicon oxide, and having an oxygen atom content lower than an oxygen atom content of the first charge trap layer;
a semiconductor layer disposed on the second charge trap layer in a direction away from the first substrate; and
a light emitting element disposed on the semiconductor layer.

2. The display device of claim 1, wherein a difference between the oxygen atom content of the first charge trap layer and the oxygen atom content of the second charge trap layer is about 4 at % to about 6 at %.

3. The display device of claim 1, wherein the oxygen atom content of the second charge trap layer is about 49 at % to about 51 at %.

4. The display device of claim 1, wherein the oxygen atom content of the first charge trap layer is about 54 at % to about 56 at %.

5. The display device of claim 1, wherein a thickness of the second charge trap layer is smaller than a thickness of the first charge trap layer.

6. The display device of claim 5, wherein a sum of the thickness of the first charge trap layer and the thickness of the second charge trap layer is about 3500 angstroms.

7. The display device of claim 5, wherein the thickness of the second charge trap layer is about 500 angstroms to about 1500 angstroms.

8. The display device of claim 5, wherein the thickness of the first charge trap layer is about 2000 angstroms to about 3000 angstroms.

9. The display device of claim 1, further comprising:
a third charge trap layer disposed between the first substrate and the buffer layer and including silicon nitride.

10. The display device of claim 9, wherein the third charge trap layer is formed under ammonia free (NH3 free) conditions.

11. The display device of claim 9, wherein the third charge trap layer is disposed between the first barrier layer and the second substrate.

12. The display device of claim 9, wherein the third charge trap layer is disposed between the second substrate and the second barrier layer.

13. The display device of claim 9, wherein the third charge trap layer is disposed on the second barrier layer.

14. The display device of claim 1, wherein the second charge trap layer is in contact with the semiconductor layer.

15. The display device of claim 1, wherein the light emitting element includes:
a pixel electrode electrically connected to the semiconductor layer;
an intermediate layer disposed on the pixel electrode; and a common electrode disposed on the intermediate layer, and wherein the display device further includes a pixel defining layer disposed on the pixel electrode including an opening exposing a portion of the pixel electrode, and having a black color.

16. The display device of claim 15, wherein the pixel defining layer includes a black pigment.

17. The display device of claim 15, wherein an optical density of the pixel defining layer is about 1.

18. A display device of claim 1, comprising:
a first substrate;
a first barrier layer disposed on the first substrate;
a second substrate disposed on the first barrier layer;
a second barrier layer disposed on the second substrate;
a buffer layer disposed on the second barrier layer;
a first charge trap layer disposed on the buffer layer and including silicon oxide;
a second charge trap layer disposed on the first charge trap layer, the second charge trap layer including silicon oxide, and having an oxygen atom content lower than an oxygen atom content of the first charge trap layer;
a semiconductor layer disposed on the second charge trap layer; and
a light emitting element disposed on the semiconductor layer,
wherein the first charge trap layer and the second charge trap layer include a hydrogen atom (H) and a nitrogen atom (N), and a ratio of N—H bonds of the second charge trap layer is greater than a ratio of N—H bonds of the first charge trap layer.

19. The display device of claim 18, wherein the ratio of the N—H bond of the second charge trap layer is about 0.7 at % to about 1 at %.

20. The display device of claim 18, wherein the ratio of the N—H bonds of the first charge trap layer is about 0.3 at % or less.

* * * * *